(12) United States Patent
Rhodes

(10) Patent No.: US 8,105,858 B2
(45) Date of Patent: Jan. 31, 2012

(54) CMOS IMAGER HAVING A NITRIDE DIELECTRIC

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 12/849,838

(22) Filed: Aug. 4, 2010

(65) Prior Publication Data

US 2010/0297807 A1    Nov. 25, 2010

Related U.S. Application Data

(62) Division of application No. 09/172,298, filed on Oct. 14, 1998, now Pat. No. 7,791,116.

(51) Int. Cl.
*H01L 21/00* (2006.01)

(52) U.S. Cl. .......................... 438/48; 438/70

(58) Field of Classification Search ............. 438/48–60, 438/70–76, E31.127, E27.133
See application file for complete search history.

(56) References Cited

U.S. PATENT DOCUMENTS

| | | | |
|---|---|---|---|
| 4,143,389 A | 3/1979 | Koike et al. | 257/292 |
| 4,374,700 A | 2/1983 | Scott et al. | |
| 4,385,307 A | 5/1983 | Suzuki | 257/234 |
| 5,241,198 A | 8/1993 | Okada et al. | 257/239 |
| 5,307,169 A | 4/1994 | Nagasaki et al. | 257/292 |
| 5,319,604 A | 6/1994 | Imondi et al. | |
| 5,334,867 A | 8/1994 | Shin et al. | 257/292 |
| 5,461,425 A | 10/1995 | Fowler et al. | |
| 5,471,515 A | 11/1995 | Fossum et al. | |
| 5,541,402 A | 7/1996 | Ackland et al. | |
| 5,576,763 A | 11/1996 | Ackland et al. | |
| 5,612,799 A | 3/1997 | Yamazaki et al. | |
| 5,614,744 A | 3/1997 | Merrill | |
| 5,625,210 A | 4/1997 | Lee et al. | |
| 5,705,846 A | 1/1998 | Merrill | |
| 5,708,263 A | 1/1998 | Wong | |
| 5,757,045 A | 5/1998 | Tsai et al. | |
| 5,804,845 A | 9/1998 | Anagnostopoulos et al. | 257/249 |
| 6,548,352 B1 * | 4/2003 | Rhodes | 438/60 |
| 6,960,795 B2 * | 11/2005 | Rhodes | 257/215 |
| 2001/0022371 A1 * | 9/2001 | Rhodes | 438/48 |
| 2003/0137025 A1 * | 7/2003 | Rhodes | 257/444 |

OTHER PUBLICATIONS

Dickinson, A., et al., *A 256×256 CMOS Active Pixel Image Sensor with Motion Detection*, 1995 IEEE International Solid-State Circuits Conference, pp. 226-227.

Dickinson, A., et al., *Standard CMOS Active Pixel Image Sensors for Multimedia Applications*, Proceedings of Sixteenth Conference on Advanced Research in VLSI, Mar. 27-29, 1995, pp. 214-224.

Eid, E-S., et al., *A 256 × 256 CMOS Active Pixel Image Sensor*, Proc. SPIE vol. 2415, Apr. 1995, pp. 265-275.

Fossum, E., *CMOS Image Sensors: Electronic Camera on a Chip*, 1995 IEEE, pp. 17-25.

(Continued)

*Primary Examiner* — Cuong Q Nguyen
(74) *Attorney, Agent, or Firm* — Dickstein Shapiro LLP

(57) ABSTRACT

An imaging device formed as a CMOS semiconductor integrated circuit includes a nitrogen containing insulating material beneath a photogate. The nitrogen containing insulating material, preferably be one of a silicon nitride layer, an ONO layer, a nitrode/oxide layer and an oxide/nitrode layer. The nitrogen containing insulating layer provides an increased capacitance in the photogate region, higher breakdown voltage, a wider dynamic range and an improved signal to noise ratio. The invention also provides a method for fabricating a CMOS imager containing the nitrogen containing insulating layer.

44 Claims, 7 Drawing Sheets

OTHER PUBLICATIONS

Fossum, E., et al., *IEDM A 37×28mm² 600k-Pixel CMOS APS Dental X-Ray Camera-on-a-Chip with Self-Triggered Readout*, 1998 IEEE International Solid-State Circuits Conference, pp. 172-173.

Fossum, E., *Low Power Camera-on-a-Chip Using CMOS Active Pixel Sensor Technology*, 1995 IEEE, pp. 74-77.

Fossum, E., *Architectures for focal plane image processing*, Optical Engineering, vol. 28, No. 8, Aug. 1989, pp. 865-871.

Janesick, J., et al., *New advancements in charge-coupled device technology—sub-electron noise and 4096×4096 pixel CCDs*, Proc. SPIE vol. 1242, 1990, pp. 223-237.

Kemeny, S.E., et al., *Update on focal-plane image processing research*, Proc. SPIE vol. 1447, 1991, pp. 243-250.

Mendis, S., et al., *CMOS Active Pixel Image Sensor*, IEEE Transactions on Electron Devices, vol. 41, No. 3, Mar. 1994, pp. 452-453.

Mendis, S.K., et al., *A 128 × 128 CMOS Active Pixel Image Sensor for Highly Integrated Imaging Systems*, 1993 IEEE, pp. 583-586.

Mendis, S.K., et al., *CMOS Active Pixel Image Sensors for Highly Integrated Imaging Systems*, IEEE Journal of Solid-State Circuits, vol. 32, No. 2, Feb. 1997, pp. 187-197.

Mendis, S.K., et al., *Low-Light-Level Image Sensor with On-Chip Signal Processing*, Proc. SPIE vol. 1952, Nov. 1993, pp. 23-33.

Mendis, S.K., et al., *Progress In CMOS Active Pixel Image Sensors*, Proc. SPIE vol. 2172, May 1994, pp. 19-29.

Nakamura, J., et al., *CMOS Active Pixel Image Sensor with Simple Floating Gate Pixels*, IEEE Transactions on Electron Devices, vol. 42, No. 9, Sep. 1995, pp. 1693-1694.

Nixon, R.H., et al., *256 × 256 CMOS Active Pixel Sensor Camera-on-a-Chip*, IEEE Journal of Solid-State Circuits, vol. 31, No. 12, Dec. 1996, pp. 2046-2050.

Nixon, R.H., et al., *256×266 CMOS Active Pixel Sensor Camera-on-a-Chip*, 1996 IEEE International Solid-State Circuits Conference, pp. 178-179.

Panicacci, R., et al., *Programmable multiresolution CMOS active pixel sensor*, Proc. SPIE vol. 2654, Mar. 1996, pp. 72-79.

Panicacci, R.A., et al., *128Mb/s Multiport CMOS Binary Active-Pixel Image Sensor*, 1996 IEEE International Solid-State Circuit Conference, pp. 100-101.

Yadid-Pecht, O., et al., *CMOS Active Pixel Sensor Star Tracker with Regional Electronic Shutter*, IEEE Journal of Solid-State Circuits, vol. 32, No. 2, Feb. 1997, pp. 285-288.

Yadid-Pecht, O., et al., *Wide dynamic range APS star tracker*, Proc. SPIE vol. 2654, Mar. 1996, pp. 82-92.

Zarnowski, J., et al., *Imaging options expand with CMOS technology*, Laser Focus World, Jun. 1997, pp. 125-130.

Zhou, Z., et al., *A CMOS Imager with On-Chip Variable Resolution for Light-Adaptive Imaging*, 1998 IEEE International Solid-State Circuits Conference, pp. 174-175.

Zhou, Z., et al., *A Digital CMOS Active Pixel Image Sensor For Multimedia Applications*, Proc. SPIE vol. 2894, Sep. 1996, pp. 282-288.

\* cited by examiner

CMOS IMAGER HAVING A NITRIDE DIELECTRIC

CROSS-REFERENCE TO RELATED APPLICATIONS

This application is a divisional of U.S. patent application Ser. No. 09/172,298, filed Oct. 14, 1998 now U.S. Pat. No. 7,791,116, now allowed, the entirety of which is hereby incorporated by reference.

FIELD OF THE INVENTION

The invention relates generally to improved semiconductor imaging devices and in particular to a silicon imaging device which can be fabricated using a standard CMOS process. Particularly, the invention relates to CMOS imager having a nitride, a layered nitride and oxide film or a layered film of $SiO_2$, SiN and $SiO_2$ ("ONO") as an insulator between the semiconductor substrate and the photogate. The invention also provides a method for fabricating the CMOS imager.

DISCUSSION OF RELATED ART

There are a number of different types of semiconductor-based imagers, including charge coupled devices (CCDs), photodiode arrays, charge injection devices and hybrid focal plan arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photo diodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046-2050, 1996; Mendis et al, "CMOS Active Pixel Image Sensors," IEEE Transactions on Electron Devices, Vol. 41(3) pp. 452-453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and the reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19-29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17-25 (1995) as well as other publications. These references are incorporated herein by reference.

Prior CMOS imagers which use a silicon dioxide ($SiO_2$) insulator between the photogate and the charge accumulation area beneath the photogate suffer from low capacitance, which reduces the signal to noise ratio of the imager. Low capacitance reduces the charge storage capacity of the accumulated electrical charge within the pixel and decreases the dynamic range of CMOS imagers. Since the size of the pixel electrical signal is very small due to the collection of photons in the photo array, the signal to noise ratio of the pixel should be as high as possible. In order to increase capacitance, a thinner $SiO_2$ insulator is required. However, if the insulator layer is too thin it inhibits proper operation of the photogate and the various transistor gates of the imager by the creation of pinhole defects, gate to substrate leakage and low breakdown voltage of the insulator.

SUMMARY OF THE INVENTION

The present invention provides an imaging device formed as a CMOS integrated circuit using a standard CMOS process. The imager circuit includes a floating diffusion region which is connected to a gate of a source follower transistor. In a preferred implementation, the CMOS imager includes a nitride, nitride/oxide or ONO insulating material between diffusion regions in the substrate and overlying gate area of the photogate. The nitrogen containing insulating material provides increased capacitance in the CMOS imager, better breakdown voltage than prior $SiO_2$ insulators, better breakdown voltage characteristics between the photogate and transfer gate for the case of a photo gate overlapping the transfer gate, and a wider dynamic range and an improved signal to noise ratio. The higher breakdown voltage also allows the imager photogate to operate at higher potentials with a further increase in charge storage capacity.

The above and other advantages and features of the invention will be more clearly understood from the following detailed description which is provided in connection with the accompanying drawings.

DETAILED DESCRIPTION OF THE PREFERRED EMBODIMENTS

Figure 4:
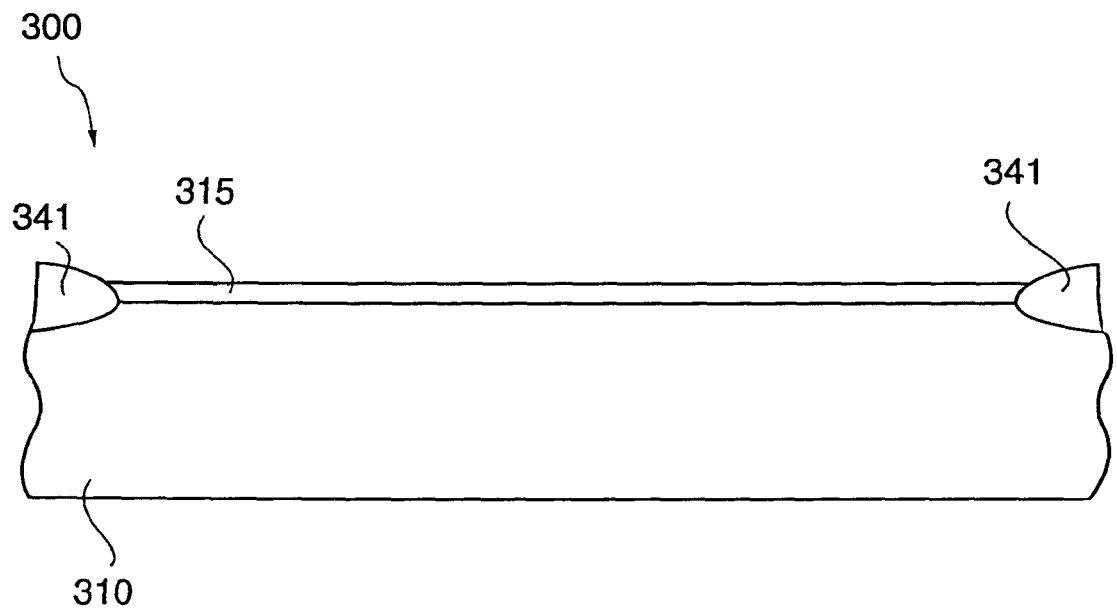
FIG. 4 illustrates a partially cut away side view of a portion of a semiconductor CMOS imager wafer in an interim stage of processing.

The present invention will now be described with reference to the figures. While the invention is described with respect to an imager pixel using n-channel transistors in a p-well, it should be understood that the present invention may also be used with p-channel transistors in an n-well. Referring now to FIG. 4. This figure shows a portion of a CMOS imager 300 at one point in the fabrication process. The substrate 310 has field oxide regions 341 formed to surround and isolate the cells which may be formed by thermal oxidation.

Figure 5:
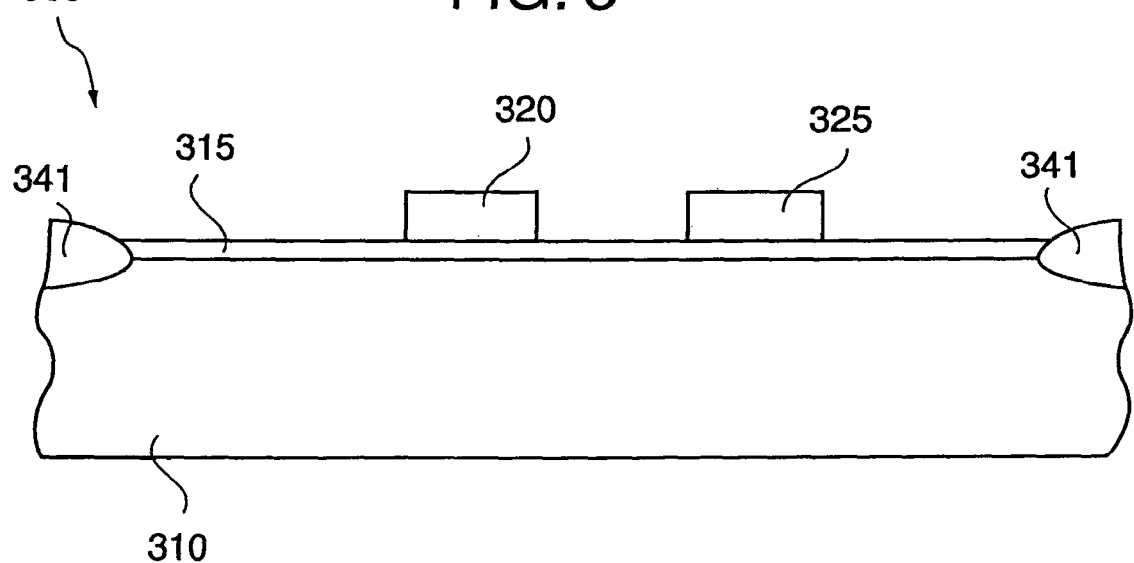
FIG. 5 illustrates a partially cut away side view of a portion of a semiconductor CMOS imager wafer subsequent to FIG. 4.

A first insulating layer 315 is grown over a surface of substrate 310. Preferably the first insulating layer 315 is a silicon dioxide layer which may be formed, i.e., grown, by conventional methods. Preferably the first insulating layer 315 is grown by thermal oxidation of silicon and the first insulating layer 315 has a thickness of from about 30 to about 500 angstroms. A transfer gate stack 320 and a reset gate stack 325 are deposited and patterned over the first insulating layer 315 as shown in FIG. 5. The gate stacks 320, 325 include a doped polysilicon layer on insulating layer 315, or a doped polysilicon layer with a silicide layer on top of the polysilicon on the insulating layer 315 or a doped polysilicon/silicide/insulator on the insulating layer 315, or the gate stacks 320, 325 may be formed of any material known to form a gate electrode.

Figure 6:
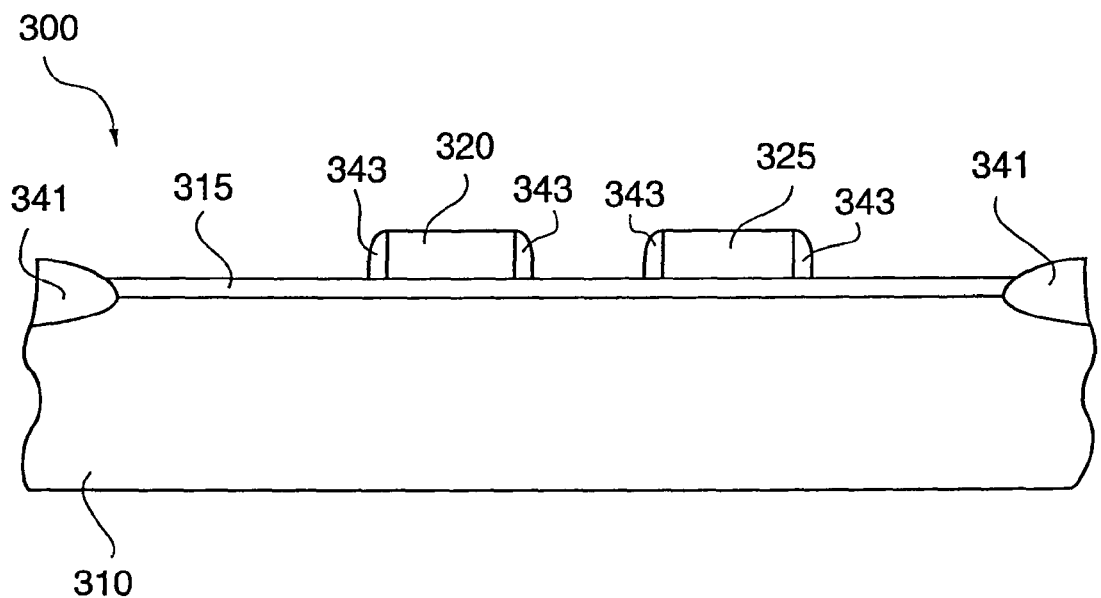
FIG. 6 illustrates a partially cut away side view of a portion of a semiconductor CMOS imager wafer subsequent to FIG. 5.

An insulating layer 343 is formed, i.e., grown, on the edges of the exposed polysilicon gate stacks 320, 325 and anisotropically etched to remove the insulator deposited on the horizontal surfaces as shown in FIG. 6. Typically the insulating layer 343 is a deposited oxide or nitride.

Figure 7:
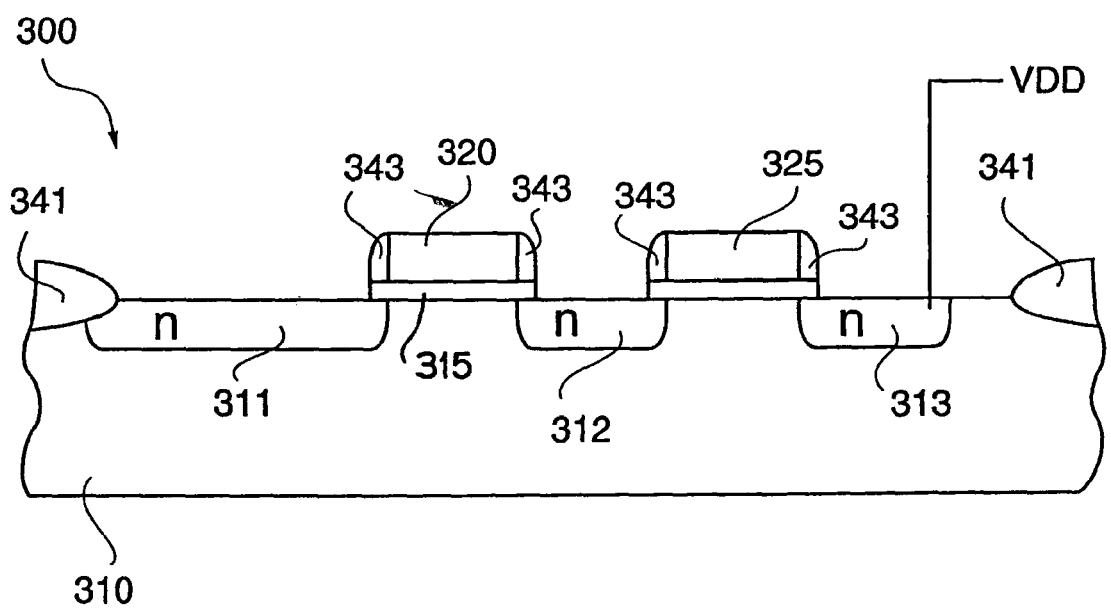
FIG. 7 illustrates a partially cut away side view of a portion of a semiconductor CMOS imager wafer subsequent to FIG. 6.

As shown in FIG. 7, the first insulating layer 315 is partly or wholly removed from the substrate by etching such that it only remains under gate stacks 320 and 325. The doped regions 312 and 313 are then formed in the substrate 310 as shown in FIG. 7. Any suitable doping process may be used, such as, for example, ion implantation. A resist and mask (not shown) may be used to shield other areas that are not to be doped. Doped region 311 may also formed in this step. The region 311 may be formed in a similar manner to doped regions 312 and 313. The doped region 311 may be formed with the same mask used for forming doped regions 312 and 313 or doped region 311 may be formed using a separate mask in an additional step. After the doped regions 311, 312 and 313 are formed, thermal processing is used to fully form regions 311, 312 and 313 under portions of the gate stacks 320 and 325 as shown in FIG. 7.

Figure 8:
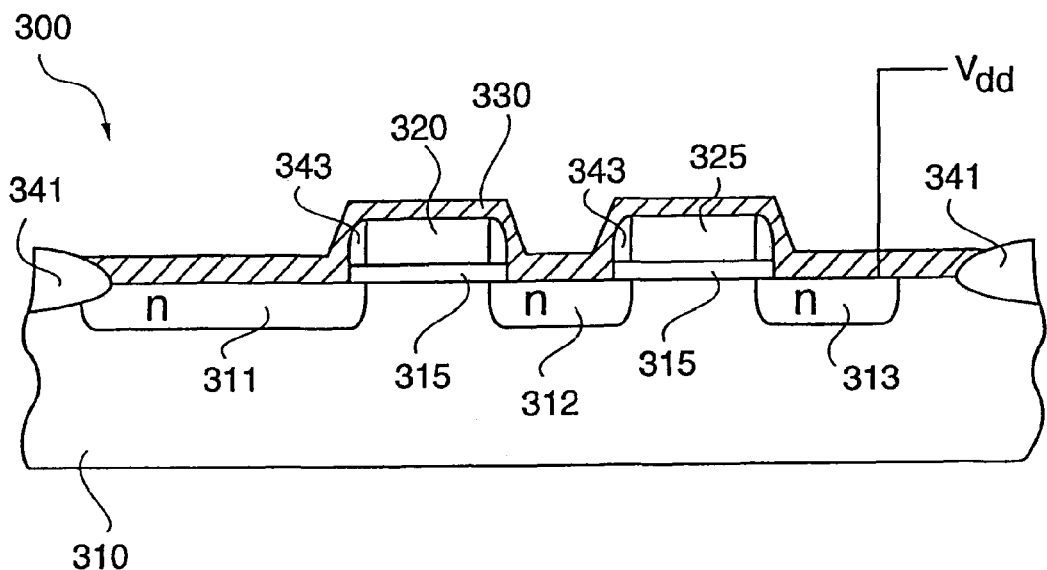
FIG. 8 illustrates a partially cut away side view of a portion of a semiconductor CMOS imager wafer subsequent to FIG. 7.
Figure 9:
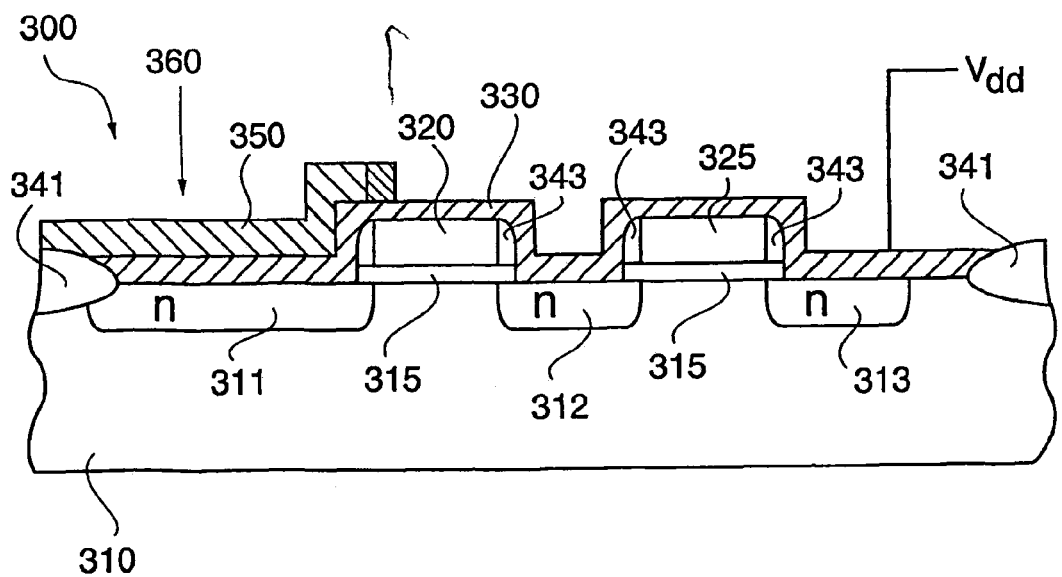
FIG. 9 illustrates a partially cut away side view of a portion of a semiconductor CMOS imager wafer subsequent to FIG. 8.

A nitrogen containing insulating layer 330 is then deposited onto the substrate as illustrated in FIG. 8. The nitrogen containing insulating layer 330 is preferably a silicon nitride layer, a nitride oxide (NO) layer, an oxide/nitride (ON) layer or an ONO (oxide-nitride-oxide) layer deposited by a combination of CVD and thermal oxidation. For example, the first oxide layer may be thermally grown or deposited by CVD. The nitride layer is then typically deposited by CVD. The final step in forming the ONO layer is to thermally oxidize the nitride layer to form the final oxide layer. However, it should be understood that any deposition or growth method may be used or any combination of growth and deposition. Preferably the nitrogen containing insulating layer has a thickness of from about 20 to about 500 angstroms, more preferably from about 30 to about 100 angstroms. A second conductive layer 350 is next deposited over the substrate 310 and the nitrogen containing insulating layer 330. Preferably the second conductive layer 350 is formed of a doped polysilicon, however any partially transparent conductive material such as indium-tin-oxide (ITO), tin oxide, indium oxide or doped hydrogenated amorphous silicon may be used. The second conductive layer 350 is patterned and etched so that the second conductive layer 350 remains over the photogate 360 as shown in FIG. 9. The deposited nitride, ON, NO, ONO film provides better isolation between gate 320 and conductor 350 than a grown or deposited oxide layer. During the etching of layer 350 or in a subsequent etch, the nitrogen containing layer 330 is removed wherever it is not covered and protected by the 350 conductor as shown in FIG. 10.

Figure 1:
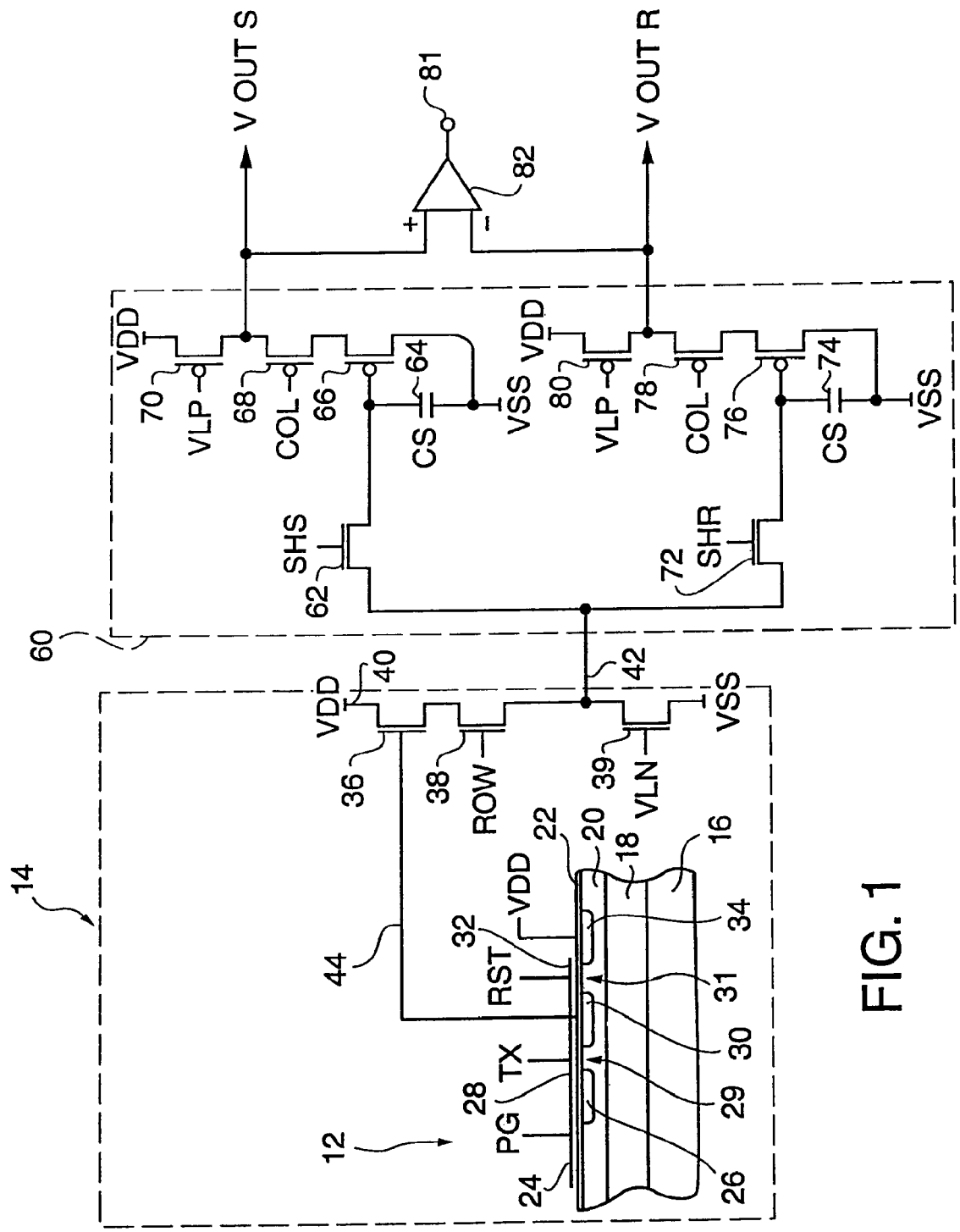
FIG. 1 is a representative circuit of a CMOS imager.
Figure 2:
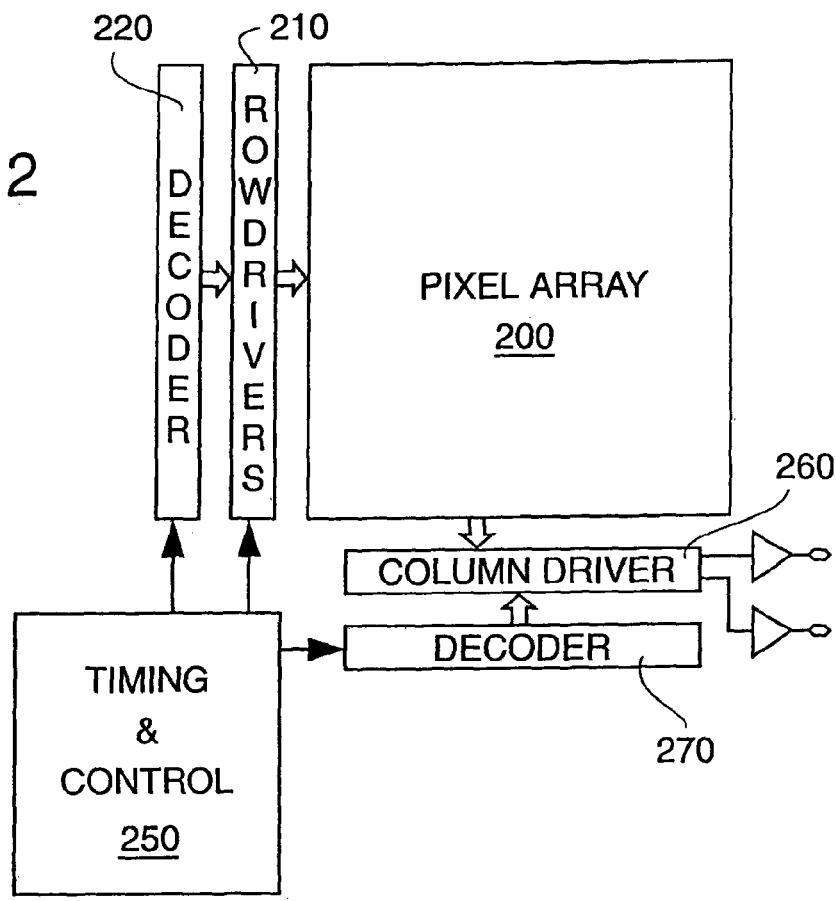
FIG. 2 is a block diagram of a CMOS active pixel sensor chip.
Figure 3:
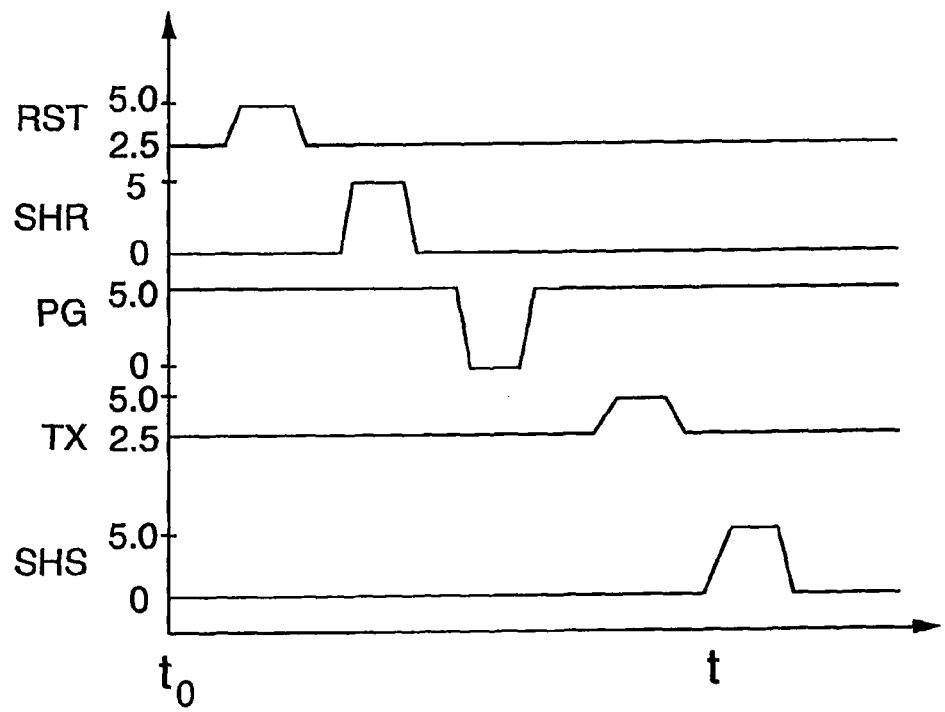
FIG. 3 is a representative timing diagram for the CMOS imager.
Figure 10:
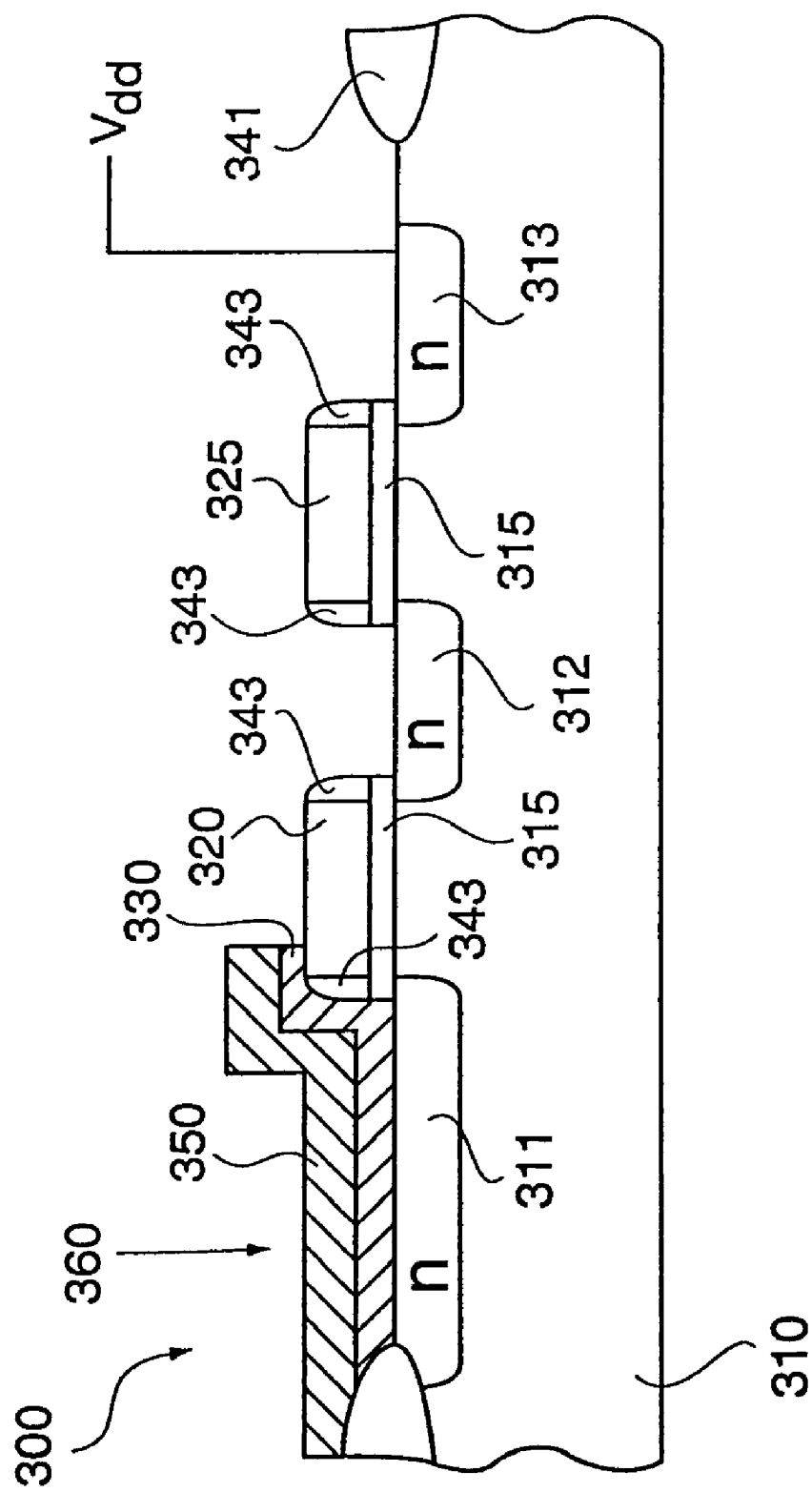
FIG. 10 illustrates a partially cut away side view of a portion of a semiconductor CMOS imager wafer subsequent to FIG. 9.

The CMOS imager 300 is processed from the device shown in FIG. 10 to an operable CMOS imager by conventional processing methods to form contacts and wiring to connect gate lines and other connections in the pixel cell. For example, the entire surface may be covered with a passivation layer of, e.g., silicon dioxide, BPSG, PSG, BSG or the like which may be planarized, typically by CMP and etched to provide contact holes, which are then metallized to provide contacts to the gates and active area diffusions of the device. Conventional multiple layers of conductors and insulators may also be used to interconnect the structures in the manner shown in FIG. 1.

The nitrogen containing layer 330 increases the capacitance between the photogate 350 and underlying n-type region 311. This improves the charge storage and signal acquisition and dynamic range of the CMOS imager sensor. The increased capacitance also provides a better signal to noise ratio, a better ability of the imager to see bright scenes and a wider dynamic range.

Figure 11:
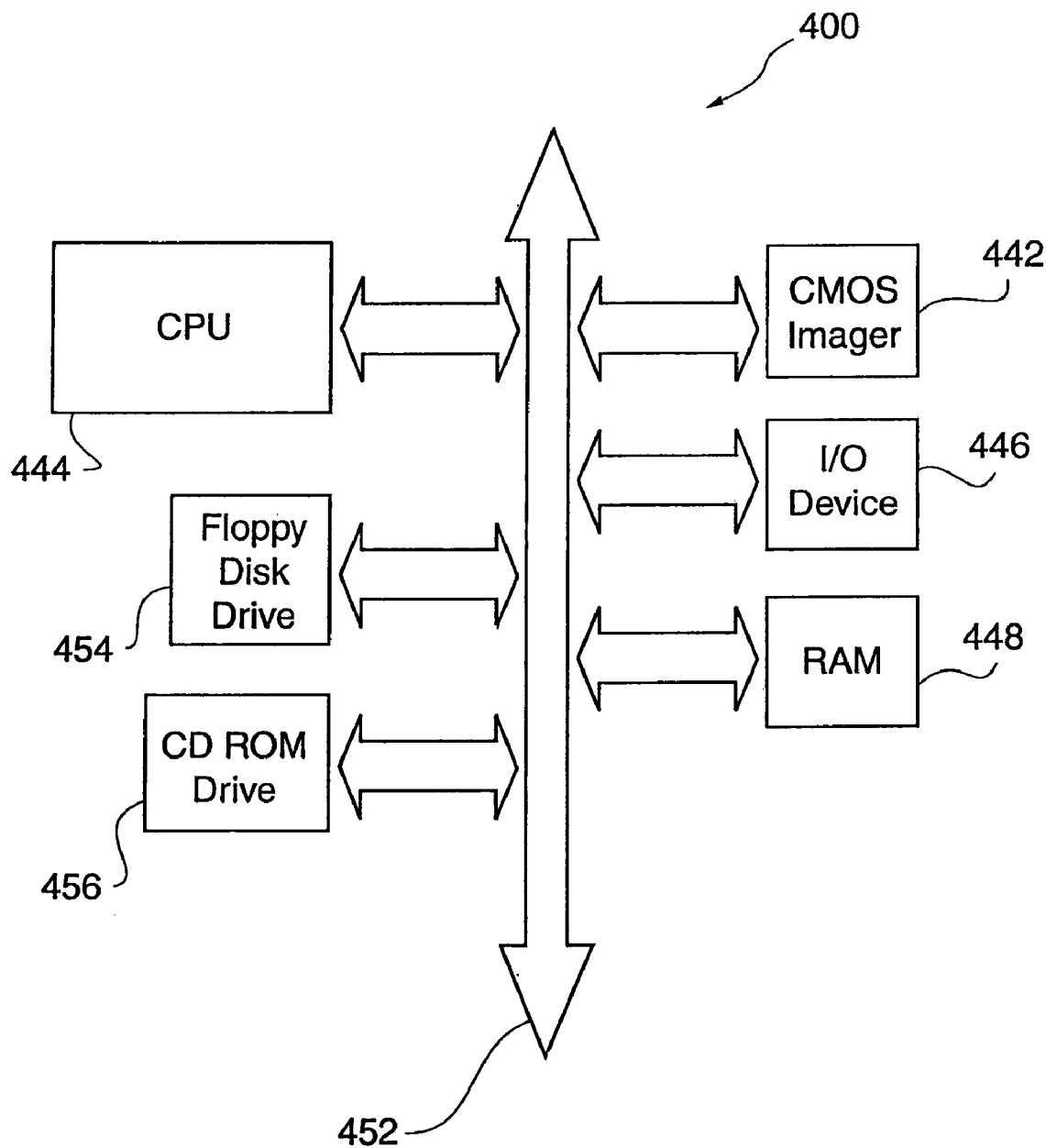
FIG. 11 is an illustration of a computer system having a CMOS imager according to the present invention.

A typical processor based system which includes a CMOS imager device according to the present invention is illustrated generally at 400 in FIG. 11. The illustrated system is exemplary of a device having digital circuits which include CMOS imager devices. Other types of processor systems which include the same or similar systems of FIG. 11 include cameras, scanners, machine vision systems, vehicle navigation systems, video telephones, computer input devices, surveillance systems, auto focus systems, star trackers, motion detection systems, image stabilization systems and data compression systems for high-definition television.

Referring to FIG. 11, a processor based system, such as a computer system, generally comprises a central processing unit (CPU) 444 that communicates with an input/output (I/O) device 446 over a bus 452. The CMOS imager 442 also communicates with the system over bus 452. The computer system 400 also includes random access memory (RAM) 448, and may include peripheral devices such as a floppy disk drive 454 and a compact disk (CD) ROM drive 456 which also communicate with CPU 444 over the bus 452. CMOS imager 442 is an integrated circuit which includes a nitrogen containing insulating layer, as previously described with respect to FIGS. 4-7.

The above description and accompanying drawings are only illustrative of preferred embodiments which can achieve the features and advantages of the present invention. For example, the CMOS imager array can be formed on a single chip together with the logic or the logic and array may be formed on separate IC chips. Further, the invention has been described with reference to n-regions and an n-doped channel in a p-well, it should be understood that the present invention includes p-regions and a p-doped channel in an n-well. Additionally, the CMOS imager is described having a transfer gate and a photogate that overlaps the transfer gate; however, the photogate need not overlap the transfer gate. Furthermore, the invention may also be used in CMOS imagers where no transfer gate is employed. The invention is not to be considered as being limited to the embodiments shown and described in detail herein as many modifications can be made without departing from the spirit and scope of the invention. Accordingly, the invention is not limited by the forgoing descriptions, but is only limited by the scope of the following claims.

What is claimed as new and desired to be protected by Letters Patent of the United States is:

1. A method for fabricating a sensor cell of a CMOS imager, comprising the steps of:

forming a doped photo-collection region in a semiconductor substrate;

forming a first insulating layer over said substrate;

forming a first conductive layer over said first insulating layer;

removing at least a portion of said first conductive layer to form at least one transistor gate over said substrate;

forming a nitrogen containing second insulating layer distinct from said first insulating layer and in contact with said semiconductor substrate, such that none of said nitrogen containing second insulating layer is located beneath said transistor gate;

forming a second conductive layer atop said nitrogen containing second insulating layer; and removing any portion of the nitrogen containing second insulating layer not located beneath the second conductive layer.

2. The method according to claim 1, wherein said first insulating layer is a silicon dioxide layer.

3. The method according to claim 1, wherein said first conductive layer is a doped polysilicon layer.

4. The method according to claim 1, wherein said doped polysilicon layer is deposited by chemical vapor deposition.

5. The method according to claim 1, wherein said first conductive layer is removed by etching.

6. The method according to claim 1, wherein said nitrogen containing second insulating layer is a silicon nitride layer.

7. The method according to claim 1, wherein said nitrogen containing second insulating layer is an ONO layer.

8. The method according to claim 1, wherein said nitrogen containing second insulating layer is an NO layer.

9. The method according to claim 1, wherein said nitrogen containing second insulating layer is an ON layer.

10. The method according to claim 8, wherein said silicon nitride layer is deposited by chemical vapor deposition.

11. The method according to claim 1, wherein said second conductive layer is a doped polysilicon layer.

12. The method according to claim 1, wherein said second conductive layer is a transparent or semi-transparent layer.

13. The method according to claim 12, wherein said second conductive layer is selected from the group consisting of indium-tin-oxide, tin oxide, indium oxide and doped hydrogenated amorphous silicon.

14. The method according to claim 11, wherein said second conductive layer of doped polysilicon is deposited by chemical vapor deposition.

15. The method according to claim 14, wherein said second conductive layer of doped polysilicon is patterned by selective etching.

16. The method according to claim 1, wherein said nitrogen containing insulating layer has a thickness of from about 20 to about 500 angstroms.

17. The method according to claim 16, wherein said nitrogen containing insulating layer has a thickness of from about 30 to about 100 angstroms.

18. The method according to claim 1, wherein said first insulating layer has a thickness of from about 20 to about 500 angstroms.

19. The method according to claim 1, wherein said second conductive layer is a doped polysilicon layer coated with a silicide layer.

20. A method for fabricating a sensor cell of a CMOS imager, comprising the steps of:
    forming a doped photo-collection region in a semiconductor substrate;
    forming a first insulating layer over said substrate;
    forming a first conductive layer over said first insulating layer;
    removing at least a portion of said first conductive layer adjacent said doped photo-collection region;
    forming a nitrogen containing second insulating layer distinct from said first insulating layer and in contact with said semiconductor substrate;
    forming a second conductive layer atop said nitrogen containing second insulating layer; and
    removing any portion of the nitrogen containing second insulating layer not located beneath the second conductive layer.

21. The method according to claim 20, wherein said first insulating layer is a silicon dioxide layer.

22. The method according to claim 20, wherein said first conductive layer is a doped polysilicon layer.

23. The method according to claim 20, wherein said doped polysilicon layer is deposited by chemical vapor deposition.

24. The method according to claim 20, wherein said first conductive layer is removed by etching.

25. The method according to claim 20, wherein said nitrogen containing second insulating layer is a silicon nitride layer.

26. The method according to claim 20, wherein said nitrogen containing second insulating layer is an ONO layer.

27. The method according to claim 20, wherein said nitrogen containing second insulating layer is an NO layer.

28. The method according to claim 20, wherein said nitrogen containing second insulating layer is an ON layer.

29. The method according to claim 20, wherein said second conductive layer is a doped polysilicon layer.

30. The method according to claim 20, wherein said second conductive layer is a transparent or semi-transparent layer.

31. The method according to claim 30, wherein said second conductive layer is selected from the group consisting of indium-tin-oxide, tin oxide, indium oxide and doped hydrogenated amorphous silicon.

32. The method according to claim 20, wherein said second conductive layer of doped polysilicon is patterned by selective etching.

33. A method for fabricating a sensor cell of a CMOS imager, comprising the steps of:
    forming a doped photo-collection region in a semiconductor substrate;
    forming a nitrogen containing insulating layer over said doped photo-collection region and in contact with said semiconductor substrate;
    forming a photogate atop said nitrogen containing insulating layer; and
    removing any portion of the nitrogen containing second insulating layer not located beneath the photogate.

34. The method according to claim 33, wherein said nitrogen containing insulating layer is a silicon nitride layer.

35. The method according to claim 33, wherein said nitrogen containing insulating layer is an ONO layer.

36. The method according to claim 33, wherein said nitrogen containing insulating layer is an NO layer.

37. The method according to claim 33, wherein said nitrogen containing insulating layer is an ON layer.

38. The method according to claim 34, wherein said silicon nitride layer is deposited by C chemical vapor deposition.

39. The method according to claim 35, wherein said ONO layer is deposited by chemical vapor deposition.

40. The method according to claim 33, wherein said nitrogen containing insulating layer has a thickness of from about 20 to about 500 angstroms.

41. The method according to claim 40, wherein said nitrogen containing insulating layer has a thickness of from about 30 to about 100 angstroms.

42. The method according to claim 33, wherein said photogate is formed of a doped polysilicon.

43. The method according to claim 33, wherein said photogate is formed of a transparent or semi-transparent material.

44. The method according to claim 43, wherein said transparent or semi-transparent material is selected from the group consisting of indium-tin-oxide, tin oxide, indium oxide and doped hydrogenated amorphous silicon.

* * * * *

UNITED STATES PATENT AND TRADEMARK OFFICE
CERTIFICATE OF CORRECTION

PATENT NO. : 8,105,858 B2
APPLICATION NO. : 12/849838
DATED : January 31, 2012
INVENTOR(S) : Howard E. Rhodes It is certified that error appears in the above-identified patent and that said Letters Patent is hereby corrected as shown below:

IN THE CLAIMS:
In column 10, line 49, in Claim 38, after "by" delete "C".

Signed and Sealed this
Twenty-seventh Day of March, 2012

David J. Kappos
*Director of the United States Patent and Trademark Office*